(12) United States Patent
Kim et al.

(10) Patent No.: US 12,324,160 B2
(45) Date of Patent: Jun. 3, 2025

(54) SEMICONDUCTOR MEMORY DEVICE AND MANUFACTURING METHOD THEREOF

(71) Applicant: SK hynix Inc., Icheon-si (KR)

(72) Inventors: Jae Taek Kim, Icheon-si (KR); Hye Yeong Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/396,042

(22) Filed: Dec. 26, 2023

(65) Prior Publication Data

US 2024/0130134 A1 Apr. 18, 2024

Related U.S. Application Data

(63) Continuation of application No. 16/934,641, filed on Jul. 21, 2020, now Pat. No. 11,925,028.

(30) Foreign Application Priority Data

Jan. 30, 2020 (KR) .................. 10-2020-0011206

(51) Int. Cl.
*H01L 21/00* (2006.01)
*H01L 23/522* (2006.01)
(Continued)

(52) U.S. Cl.
CPC ......... *H10B 43/50* (2023.02); *H01L 23/5226* (2013.01); *H01L 23/528* (2013.01); *H10B 41/10* (2023.02); *H10B 41/40* (2023.02); *H10B 41/50* (2023.02); *H10B 43/10* (2023.02); *H10B 63/30* (2023.02); *H10B 41/27* (2023.02); *H10B 43/27* (2023.02)

(58) Field of Classification Search
CPC ........ H10B 43/50; H10B 41/50; H10B 41/10; H10B 63/30; H10B 41/40; H10B 43/10; H10B 41/27; H10B 43/27; H01L 23/5226; H01L 23/528
See application file for complete search history.

(56) References Cited

U.S. PATENT DOCUMENTS 9,805,805 B1 10/2017 Zhang et al.
10,199,326 B1 2/2019 Ohsaki
(Continued)

FOREIGN PATENT DOCUMENTS

CN 108735760 A 11/2018
CN 109314147 A 2/2019
(Continued)

*Primary Examiner* — Richard A Booth
(74) *Attorney, Agent, or Firm* — WILLIAM PARK & ASSOCIATES LTD.

(57) ABSTRACT

A semiconductor memory device, and a manufacturing method of the semiconductor memory device, includes a peripheral transistor, a first insulating layer covering the peripheral transistor, a source layer on the first insulating layer, and a stack structure on the source layer. The semiconductor memory device also includes a peripheral contact structure penetrating the stack structure and the source layer, the peripheral contact structure being electrically connected to the peripheral transistor. The stack structure includes a stepped structure including a step side surface and a step top surface. The peripheral contact structure is in contact with the step side surface.

7 Claims, 12 Drawing Sheets

(51) Int. Cl.
  *H01L 23/528* (2006.01)
  *H10B 41/10* (2023.01)
  *H10B 41/40* (2023.01)
  *H10B 41/50* (2023.01)
  *H10B 43/10* (2023.01)
  *H10B 43/50* (2023.01)
  *H10B 63/00* (2023.01)
  *H10B 41/27* (2023.01)
  *H10B 43/27* (2023.01)

(56) References Cited

U.S. PATENT DOCUMENTS

| | | | |
|---|---|---|---|
| 10,651,190 B2* | 5/2020 | Nagashima | H10B 43/10 |
| 10,892,279 B1* | 1/2021 | Sakotsubo | H01L 29/7883 |
| 2016/0225785 A1 | 8/2016 | Kim et al. | |
| 2017/0338241 A1 | 11/2017 | Lee | |
| 2018/0040629 A1 | 2/2018 | Eom et al. | |
| 2018/0122819 A1 | 5/2018 | Shim et al. | |
| 2018/0240811 A1 | 8/2018 | Kim et al. | |
| 2018/0301374 A1* | 10/2018 | Masamori | H10B 43/40 |
| 2018/0308559 A1 | 10/2018 | Kim et al. | |
| 2019/0148505 A1 | 5/2019 | Eom et al. | |
| 2019/0273088 A1 | 9/2019 | Cui et al. | |
| 2019/0378857 A1 | 12/2019 | Lee | |
| 2021/0288067 A1 | 9/2021 | Kanamori et al. | |

FOREIGN PATENT DOCUMENTS

| | | |
|---|---|---|
| CN | 110581135 A | 12/2019 |
| KR | 1020160118114 A | 10/2016 |
| KR | 1020160136919 A | 11/2016 |
| KR | 1020190026418 A | 3/2019 |
| KR | 1020190136788 A | 12/2019 |

* cited by examiner

SEMICONDUCTOR MEMORY DEVICE AND MANUFACTURING METHOD THEREOF

CROSS-REFERENCE TO RELATED APPLICATION

The present application is a continuation application of U.S. patent application Ser. No. 16/934,641, filed on Jul. 21, 2020, and claims priority under 35 U.S.C. § 119(a) to Korean patent application number 10-2020-0011206, filed on Jan. 30, 2020, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

A semiconductor memory device includes memory cells capable of storing data.

According to a method of storing data and a method of retaining data, the semiconductor memory device may be classified as a volatile semiconductor memory device or a nonvolatile semiconductor memory device. A volatile semiconductor memory device is a memory device in which stored data is lost when the supply of power is interrupted, and a nonvolatile semiconductor memory device is a memory device in which stored data is retained even when the supply of power is interrupted.

Recently, as portable electronic devices are increasingly used, nonvolatile semiconductor memory devices have been increasingly used, and high integration and large capacity semiconductor memory devices have been required so as to achieve portability and large capacity. In order to achieve portability and large capacity, three-dimensional semiconductor memory devices have been proposed.

SUMMARY

In accordance with an aspect of the present disclosure, a semiconductor memory device includes: a peripheral transistor; a first insulating layer covering the peripheral transistor; a source layer on the first insulating layer; a stack structure on the source layer; and a peripheral contact structure penetrating the stack structure and the source layer, the peripheral contact structure being electrically connected to the peripheral transistor. The stack structure includes a stepped structure including a step side surface and a step top surface. The peripheral contact structure is in contact with the step side surface.

In accordance with another aspect of the present disclosure, a semiconductor memory device includes: a peripheral transistor; a first insulating layer covering the peripheral transistor; a source layer on the first insulating layer; a stack structure on the source layer; and a peripheral contact structure penetrating the stack structure and the source layer, the peripheral contact structure being electrically connected to the peripheral transistor. The stack structure includes alternately stacked insulating patterns and conductive patterns. The peripheral contact structure is in contact with the conductive patterns, and a level of an uppermost portion of the peripheral contact structure is higher than a level of an uppermost conductive pattern among the conductive patterns.

In accordance with still another aspect of the present disclosure, a method of manufacturing a semiconductor memory device includes: forming a peripheral transistor on a substrate; forming a source layer over the peripheral transistor; forming a stack structure over the source layer; forming a peripheral contact structure penetrating the stack structure and the source layer, the peripheral contact structure being electrically connected to the peripheral transistor; and forming conductive patterns in the stack structure.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments can be implemented in various forms, and should not be construed as being limited to the embodiments set forth herein.

Some embodiments provide a semiconductor memory device capable of improving operational reliability and a manufacturing method of the semiconductor memory device.

Figure 1A:
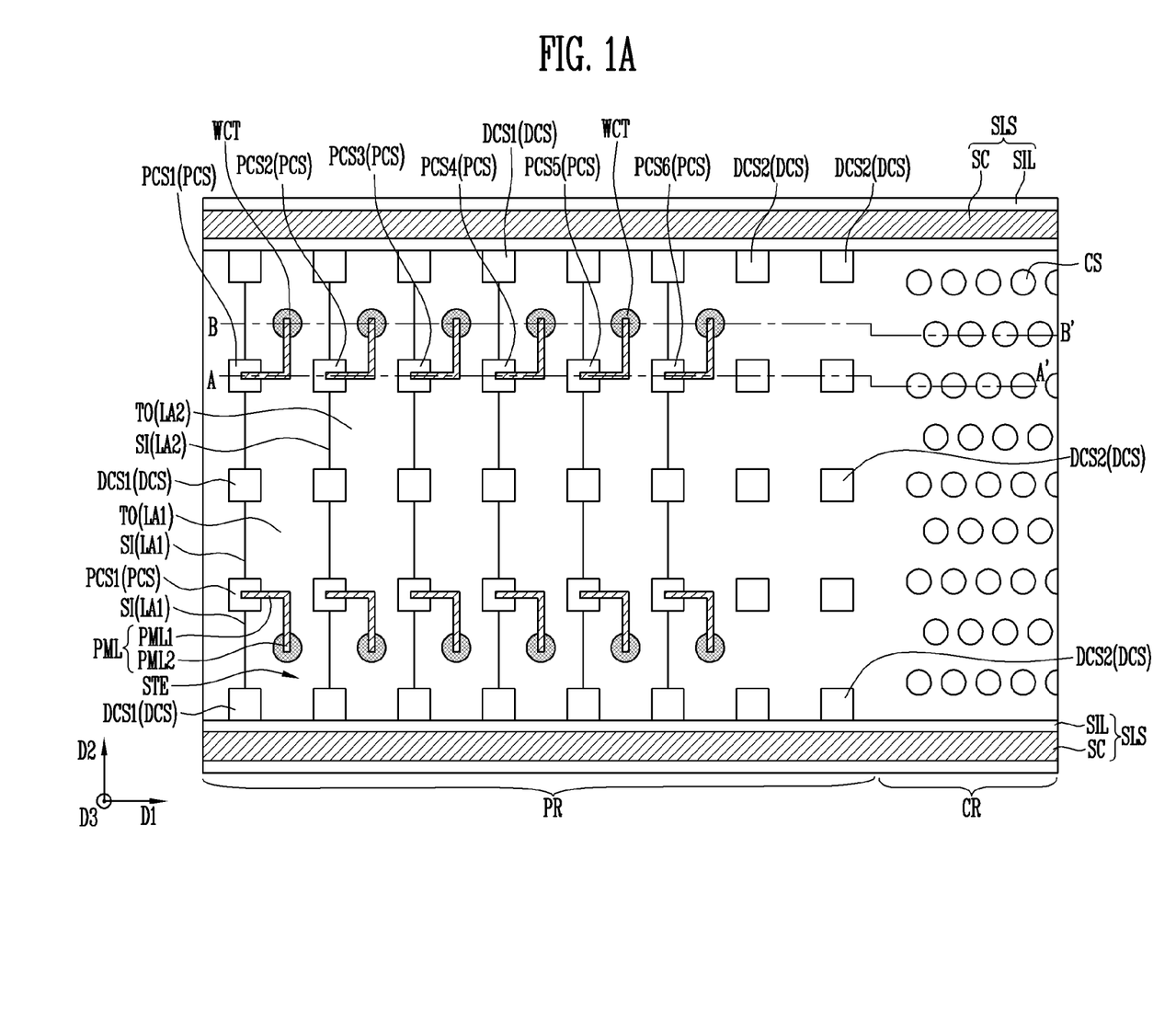
FIG. 1A is a plan view of a semiconductor memory device in accordance with an embodiment of the present disclosure.
Figure 1B:
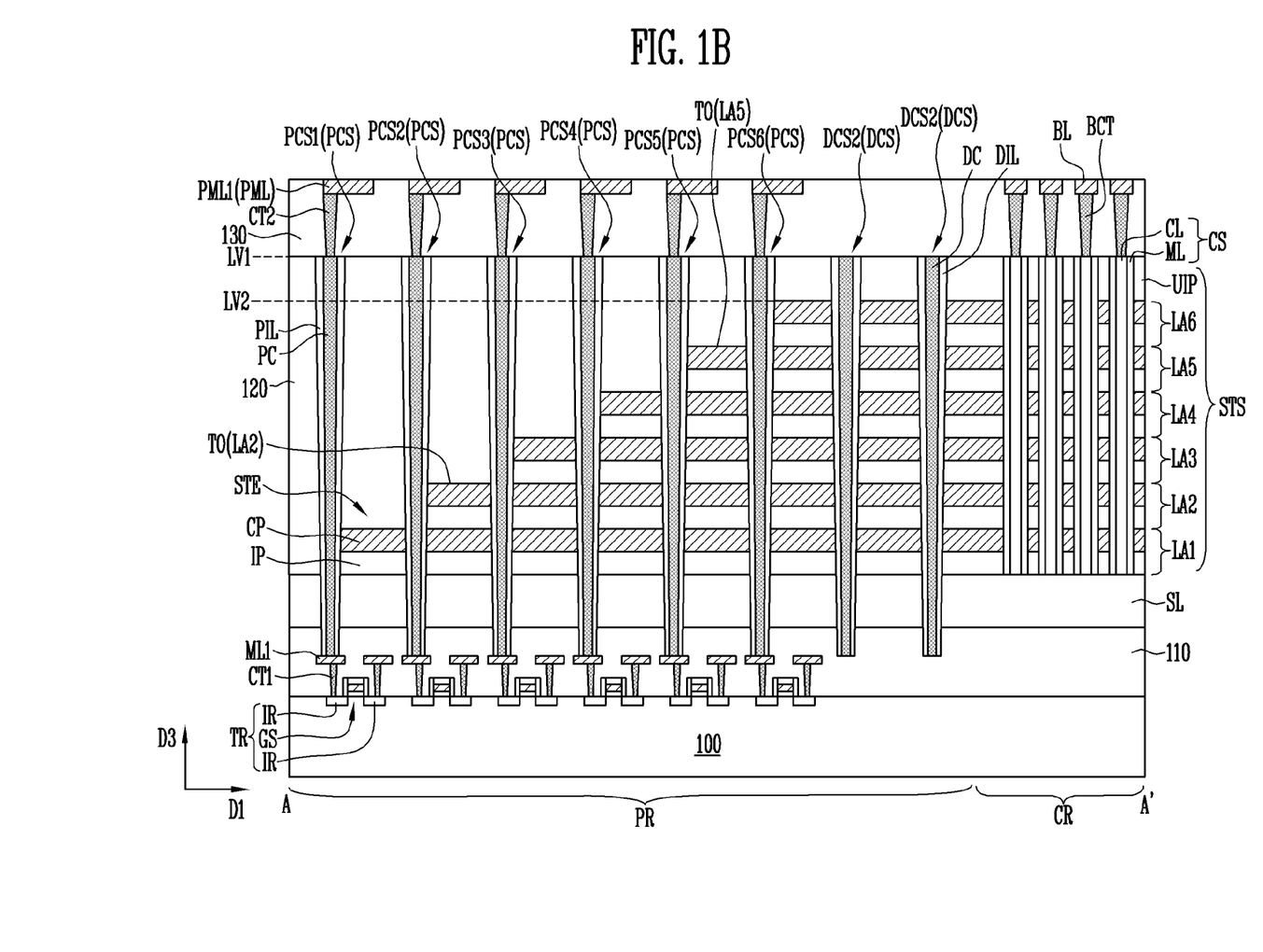
FIG. 1B is a sectional view taken along line A-A' shown in FIG. 1A.
Figure 1C:
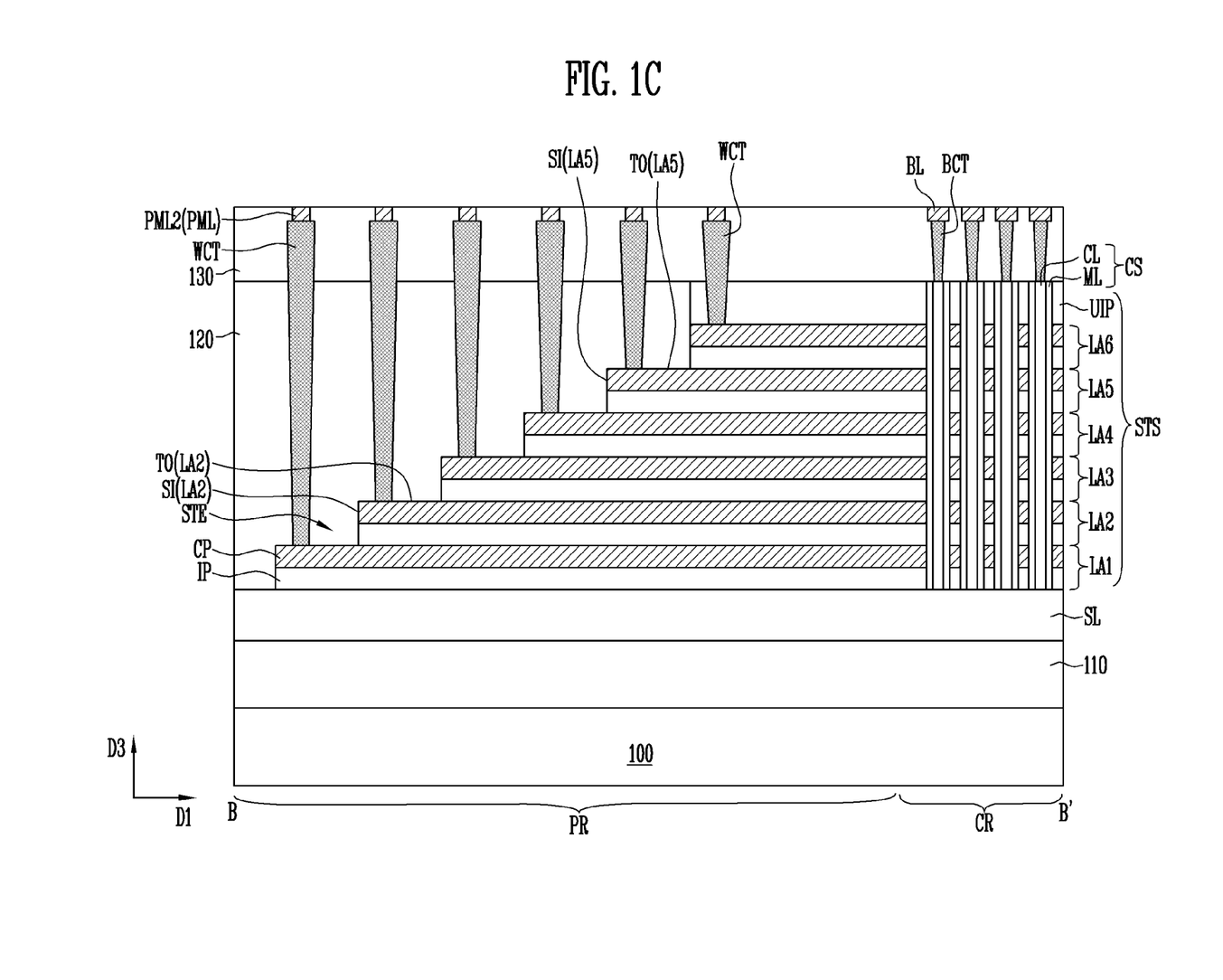
FIG. 1C is a sectional view taken along line B-B' shown in FIG. 1A.

FIG. 1A is a plan view of a semiconductor memory device in accordance with an embodiment of the present disclosure. FIG. 1B is a sectional view taken along line A-A' shown in FIG. 1A. FIG. 1C is a sectional view taken along line B-B' shown in FIG. 1A.

Referring to FIGS. 1A to 1C, the semiconductor memory device in accordance with this embodiment may include a substrate 100. The substrate 100 may have the shape of a plate expanding along a plane defined by a first direction D1 and a second direction D2. The substrate 100 may be a single crystalline semiconductor substrate. For example, the substrate 100 may be a bulk silicon substrate, a silicon-on-insulator substrate, a germanium substrate, a germanium-on-insulator substrate, a silicon-germanium substrate, or an epitaxial thin film formed through a selective epitaxial growth process. The substrate 100 may include a cell region CR and a peripheral region PR.

A first insulating layer 110 may be provided on the substrate 100. The first insulating layer 110 may have the shape of a plate expanding along a plane defined by the first direction D1 and the second direction D2. In an example, the first insulating layer 110 may include oxide or nitride.

Peripheral transistors TR may be provided on the substrate 100. The peripheral transistors TR may be provided between the substrate 100 and the first insulating layer 110. The peripheral transistors TR may be covered by the first insulating layer 110. Each of the peripheral transistors TR may include impurity regions IR and a gate structure GS. The impurity regions IR may constitute a portion of the substrate 100. The impurity regions IR may be formed by doping an impurity into the substrate 100. The gate structure GS may be disposed between the impurity regions IR. The gate structure GS may include a gate electrode, a gate insulating layer, a gate capping layer, and gate spacers. The gate electrode may be spaced apart from the substrate 100 by the gate insulating layer. The gate capping layer may cover the gate electrode. The gate spacers may be disposed at both sides of the gate insulating layer, the gate capping layer, and the gate electrode. In an example, the gate electrode may include a metal or a conductive semiconductor material. In an example, the gate spacers, the gate insulating layer, and the gate capping layer may include silicon oxide. A channel may be formed between the impurity regions IR by an operation of the gate structure GS. The peripheral transistor TR may be an N-type metal-oxide-semiconductor (NMOS) transistor or a P-type metal-oxide-semiconductor (PMOS) transistor.

Although not shown in the drawings, a resistor and a capacitor may be further provided in the first insulating layer 110. The peripheral transistors TR, the resistor, and the capacitor may be used as elements constituting a row decoder, a column decoder, a page buffer circuit, and an input/output circuit.

First contacts CT1 and first lines ML1 may be provided in the first insulating layer 110. The first contacts CT1 may be connected to the peripheral transistors TR. The first lines ML1 may be connected to the first contacts CT1. The first contacts CT1 and the first lines ML1 may include a conductive material. In an example, the first contacts CT1 and the first lines ML1 may include copper, tungsten or aluminum.

A source layer SL may be provided on the first insulating layer 110. The source layer SL may have the shape of a plate expanding along a plane defined by the first direction D1 and the second direction D2. The source layer SL may be used as a source line. The source layer SL may include doped poly-silicon.

A stack structure STS may be provided on the source layer SL. The stack structure STS may include first to sixth stack layers LA1, LA2, LA3, LA4, LA5, and LA6 and an upper insulating pattern UIP. Although a case where the stack structure STS includes six stack layers is described in this embodiment, the number of stack layers included in the stack structure STS is not limited thereto.

The first to sixth stack layers LA1, LA2, LA3, LA4, LA5, and LA6 may be sequentially stacked in a third direction D3. In other words, the first to sixth stack layers LA1, LA2, LA3, LA4, LA5, and LA6 may be vertically stacked.

Each of the first to sixth stack layers LA1, LA2, LA3, LA4, LA5, and LA6 may include an insulating pattern IP and a conductive pattern CP on the insulating pattern IP. The insulating patterns IP and the conductive patterns CP of the stack structure STS may be alternately stacked in the third direction D3. In an example, the insulating pattern IP may include silicon oxide. The conductive pattern CP may include a gate conductive layer. In an example, the gate conductive layer may include at least one of a doped silicon layer, a metal silicide layer, tungsten, nickel, and cobalt, and be used as a word line connected to a memory cell or a select line connected to a select transistor. The conductive pattern CP may further include a gate barrier layer surrounding the gate conductive layer. In an example, the gate barrier layer may include at least one of titanium nitride and tantalum nitride.

The stack structure STS may include a stepped structure STE disposed on the peripheral region PR of the substrate 100. The stepped structure STE of the stack structure STS may be formed according to the stacked structure of the first to sixth stack layers LA1, LA2, LA3, LA4, LA5, and LA6. Portions of the first to sixth stack layers LA1, LA2, LA3, LA4, LA5, and LA6, which are disposed on the peripheral region PR of the substrate 100, may constitute the stepped structure STE.

Each of the first to sixth stack layers LA1, LA2, LA3, LA4, LA5, and LA6 may include a step top surface TO. The step top surfaces TO may be portions of top surfaces of the first to fifth stack layers LA1, LA2, LA3, LA4, and LA5, respectively. The step top surface TO might not be covered by another stack layer. In an example, the step top surface TO of the first stack layer LA1 may be a portion of the top surface of the first stack layer LA1, which is not covered by the second stack layer LA2. The step top surface TO may be a portion of a top surface of the conductive pattern CP. The step top surfaces TO may be perpendicular to the third direction D3. The step top surfaces TO may extend in the second direction D2. The step top surfaces TO may be covered by a second insulating layer 120 which will be described later.

The sixth stack layer LA6 might not include the step top surface TO. A top surface of the sixth stack layer LA6 may be completely covered by the upper insulating pattern UIP.

Each of the first to sixth stack layers LA1, LA2, LA3, LA4, LA5, and LA6 may include a plurality of step side surfaces SI. Each of the step side surfaces SI may include a side surface of the insulating pattern IP and a side surface of the conductive pattern CP. The step side surfaces SI may be surfaces located most distant from the cell region CR of the substrate 100 of the first to sixth stack layers LA1, LA2, LA3, LA4, LA5, and LA6. The step side surfaces SI may be perpendicular to the first direction D1. The step side surfaces SI may extend in the second direction D2. The step side surfaces SI may be covered by the second insulating layer 120 which will be described later.

The step side surfaces SI may connect the step top surfaces TO to each other. In an example, the step side surfaces of the second stack layer LA2 may connect the step top surface TO of the first stack layer LA1 and the step top surface TO of the second stack layer LA2 to each other. A surface of the stepped structure STE of the stack structure STS may be defined by the step top surfaces TO and the step side surfaces SI. The surface of the stepped structure STE of the stack structure STS may include the step side surfaces SI and the step top surfaces TO.

Channel structures CS penetrating the stack structure STS may be provided. The channel structures CS may penetrate the upper insulating pattern UIP, the insulating patterns IP, and the conductive patterns CP of the stack structure STS. The channel structures CS may extend in the third direction D3. The channel structure CS may be in contact with the source layer SL.

Each of the channel structures CS may include a channel layer CL penetrating the stack structure STS and a memory layer ML surrounding the channel layer CL. In an example, the channel layer CL may include doped poly-silicon or undoped poly-silicon. The channel layer CL may be electrically connected to the source layer SL.

The memory layer ML may include multi-layered insulating layers. The memory layer ML may include a tunnel layer surrounding the channel layer CL, a storage layer surrounding the tunnel layer, and a blocking layer surrounding the storage layer. The tunnel layer may include an insulating material through which charges can tunnel. In an example, the tunnel layer may include oxide. The storage layer may include a material in which charges can be trapped. In an example, the storage layer may include at least one of nitride, silicon, a phase change material, and nano dots. The blocking layer may include an insulating material capable of blocking movement of charges. In an example, the blocking layer may include oxide. A thickness of the tunnel layer may be thinner than that of the blocking layer.

Unlike as shown in the drawings, the channel structure CS may further include a filling layer in the channel layer CL. In an example, the filling layer may include oxide.

Peripheral contact structures PCS and dummy contact structures DCS may be provided, which penetrate the stack structure STS and the source layer SL. The peripheral contact structures PCS and the dummy contact structures DCS may penetrate the insulating patterns IP and the conductive patterns CP of the stack structure STS. The peripheral contact structures PCS and the dummy contact structures DCS may extend in the third direction D3. The peripheral contact structures PCS and the dummy contact structures DCS may be in contact with the conductive patterns CP of the stack structure STS. The peripheral contact structures PCS and the dummy contact structures DCS may support the stepped structure STE of the stack structure STS.

Lengths of the peripheral contact structures PCS and the dummy contact structures DCS in the third direction D3 may be all the same. The level of uppermost portions of the peripheral contact structures PCS and the dummy contact structures DCS may be defined as a first level LV1. The level of an uppermost portion of the conductive pattern of the sixth stack layer LA6 may be defined as a second level LV2. The first level LV1 may be higher than the second level LV2. In other words, the level of the uppermost portions of the peripheral contact structures PCS and the dummy contact structures DCS may be higher than that of a conductive pattern at an uppermost portion of the stack structure STS.

The peripheral contact structure PCS may be electrically connected to the peripheral transistor TR. The peripheral contact structure PCS may include a peripheral contact PC which penetrates the stack structure STS and the source layer SL and is electrically connected to the peripheral transistor TR and a peripheral insulating layer PIL surrounding the peripheral contact PC. The peripheral contact PC may include a conductive material. In an example, the peripheral contact PC may include copper, aluminum or tungsten. In an example, the peripheral insulating layer PIL may include silicon oxide.

The dummy contact structure DCS may be electrically floated. In other words, the dummy contact structure DCS may be electrically isolated. The dummy contact structure DCS may include a dummy contact DC penetrating the stack structure STS and the source layer SL and a dummy insulating layer DIL surrounding the dummy contact DC. The dummy contact may include a conductive material. In an example, the dummy contact DC may include copper, aluminum, or tungsten. In an example, the dummy insulating layer DIL may include silicon oxide.

The peripheral contact structures PCS may include first to sixth peripheral contact structure PCS1, PCS2, PCS3, PCS4, PCS5, and PCS6. The first peripheral contact structures PCS1 may be in contact with the step side surfaces SI of the first stack layer LA1, the second peripheral contact structures PCS2 may be in contact with the step side surfaces SI of the second stack layer LA2, the third peripheral contact structures PCS3 may be in contact with the step side surfaces SI of the third stack layer LA3, the fourth peripheral contact structures PCS4 may be in contact with the step side surfaces SI of the fourth stack layer LA4, the fifth peripheral contact structures PCS5 may be in contact with the step side surfaces SI of the fifth stack layer LA5, and the sixth peripheral contact structures PCS6 may be in contact with the step side surfaces of the sixth stack layer LA6.

Each of the peripheral contact structures PCS may be disposed between two step side surfaces SI. In an example, the first peripheral contact structure PCS1 may be disposed between the step side surfaces SI of the first stack layer LA1.

The second peripheral contact structure PCS2 may penetrate the step top surface TO of the first stack layer LA1 and the step top surface TO of the second stack layer LA2, the third peripheral contact structure PCS3 may penetrate the step top surface TO of the second stack layer LA2 and the step top surface TO of the third stack layer LA3, the fourth peripheral contact structure PCS4 may penetrate the step top surface TO of the third stack layer LA3 and the step top surface TO of the fourth stack layer LA4, and the fifth peripheral contact structure PCS5 may penetrate the step top surface TO of the fourth stack layer LA4 and the step top surface TO of the fifth stack layer LA5. As described above, some of the peripheral contact structures PCS may penetrate both two step top surfaces TO adjacent to each other. Levels of the two step top surfaces TO adjacent to each other may be different from each other. In an example, a level of the step top surface TO of the first stack layer LA1 may be lower than that of the step top surface TO of the second stack layer LA2.

The first to sixth peripheral contact structure PCS1, PCS2, PCS3, PCS4, PCS5, and PCS6 may be arranged in the first direction D1. Lengths of the first to sixth peripheral contact structure PCS1, PCS2, PCS3, PCS4, PCS5, and PCS6 in the third direction D3 may be the same.

The peripheral contact structure PCS may penetrate a side end portion of each of the first to sixth stack layers LA1, LA2, LA3, LA4, LA5, and LA6. In an example, the first peripheral contact structure PCS1 may penetrate the side end portion of the first stack layer LA1. The side end portion may a portion which defines the step side surfaces SI of each of the first to sixth stack layers LA1, LA2, LA3, LA4, LA5, and LA6.

The dummy contact structures DCS may include first dummy contact structures DCS1 and second dummy contact structures DCS2. Lengths of the first dummy contact structures DCS1 and second dummy contact structures DCS2 in the third direction D3 may be the same.

Similarly to the peripheral contact structures PCS, the first dummy contact structures DCS1 may be in contact with the step side surfaces SI. Some of the first dummy contact structures DCS1 may penetrate both step top surfaces TO adjacent to each other. The peripheral contact structures PCS may be disposed between the first dummy contact structures DCS1. In an example, the first peripheral contact structure PCS1 may be disposed between two first dummy contact structures DCS1. Some of the first dummy contact structures DCS1 may be disposed between the peripheral contact structures PCS. In an example, the first dummy contact structure DCS1 may be disposed between two first peripheral contact structures PCS1. The first dummy contact structure DCS1 may penetrate the side end portion of each of the first to sixth stack layers LA1, LA2, LA3, LA4, LA5, and LA6. The first dummy contact structures DCS1 and the peripheral contact structures PCS may be alternately arranged in the second direction D2.

The second dummy contact structures DCS2 may be dummy contact structures DCS adjacent to the cell region CR of the substrate 100. The second dummy contact structures DCS2 may be disposed closer to the cell region CR than the peripheral contact structures PCS and the first dummy contact structures DCS1. The second dummy contact structures DCS2 may be disposed adjacent to the channel structures CS. The second dummy contact structure DCS2 may be two-dimensionally surrounded by the stack structure STS.

Some of the first and second dummy contact structures DCS1 and DCS2 may be in contact with a source insulating layer SIL which will be described later.

Slit structures SLS may be provided on the source layer SL. The slit structures SLS may extend in the first direction D1. The slit structures SLS may penetrate the stack structure STS and be connected to the source layer SL. The stack structure STS, the channel structures CS, the peripheral contact structures PCS, and the dummy contact structures DCS may be provided between the slit structures SLS.

Each of the slit structures SLS may include a source contact SC and source insulating layers SIL at both sides of the source contact SC. The source contact SC and the source insulating layers SIL may extend in the first direction D1. The source insulating layer SIL may be provided between the source contact SC and the stack structure STS. The source contact SC may include a conductive material. In an example, the source contact SC may include a metal or a doped semiconductor material. In an example, the source insulating layers SIL may include an insulating material.

The second insulating layer 120 may be provided on the stack structure STS. The second insulating layer 120 may cover the stepped structure STE of the stack structure STS. The second insulating layer 120 may be in contact with the step side surfaces SI and the step top surfaces TO of the stepped structure STE of the stack structure STS. In an example, the second insulating layer 120 may include oxide or nitride.

A third insulating layer 130 may be provided on the second insulating layer 120. The third insulating layer 130 may cover the stack structure STS, the channel structure CS, the second insulating layer 120, the dummy contact structures DCS, and the peripheral contact structures PCS. In an example, the third insulating layer 130 may include oxide or nitride.

Word line contacts WCT may be provided, which are connected to the first to sixth stack layers LA1, LA2, LA3, LA4, LA5, and LA6 of the stack structure STS. The word line contacts WCT may be in contact with the step top surfaces TO of the first to sixth stack layers LA1, LA2, LA3, LA4, LA5, and LA6. Some of the word line contact WCT may be disposed between the step side surfaces SI. The word line contacts WCT may be disposed between the peripheral contact structures PCS. The word line contacts WCT may include a conductive material. In an example, the word line contacts WCT may include copper, aluminum or tungsten.

A second contact CT2 connected to the peripheral contact structures PCS may be provided. The second contact CT2 may be connected to the peripheral contact PC of the peripheral contact structure PCS. The second contacts CT2 may include a conductive material. In an example, the second contact CT2 may include copper, aluminum or tungsten.

Peripheral lines PML may be provided, which are connected to the word line contacts WCT and the second contacts CT2. Each of the peripheral lines PML may connect the word line contact WCT and the second contact CT2 to each other. The peripheral transistor TR may be electrically connected to the conductive pattern PC through the first contact CT1, the first line ML1, the peripheral contact PC of the peripheral contact structures PCS, the second contact CT2, the peripheral line PML, and the word line contact WCT.

Two peripheral lines PML connected to one stack layer LA1 may be disposed symmetrical to each other. In an example, the peripheral lines PML connected to the first stack layer LA1 may be disposed symmetrically to each other with respect to the first dummy contact structure DCS1 disposed between the first peripheral contact structures PCS1.

Each of the peripheral lines PML may include a first part PML1 extending in the first direction D1 and a second part PML2 extending in the second direction D2. The first part PML1 may be connected to the second contact CT2, and the second part PML2 may be connected to the word line contact WCT. In an example, the peripheral lines PML may include a conductive material. In an example, the peripheral lines PML may include copper, aluminum, or tungsten.

Bit line contacts BCT connected to the channel structures CS may be provided. The bit line contact BCT may be connected to the channel layer CL of the channel structure CS. The bit line contact BCT may include a conductive material. In an example, the bit line contacts BCT may include copper, aluminum, or tungsten.

Bit lines BL connected to the bit line contacts BCT may be provided. The bit lines BL may extend in the second direction D2. The bit lines BL may be arranged in the first direction D1.

In the semiconductor memory device in accordance with this embodiment, the peripheral transistor TR and the conductive pattern CP are electrically connected to each other through the peripheral contact structure PCS supporting the stack structure STS, so that the structure of the peripheral lines PML connecting the peripheral contact structures PCS and the word line contacts WCT can be simplified. Accordingly, the operational reliability of the semiconductor memory device can be improved.

Figure 2A:
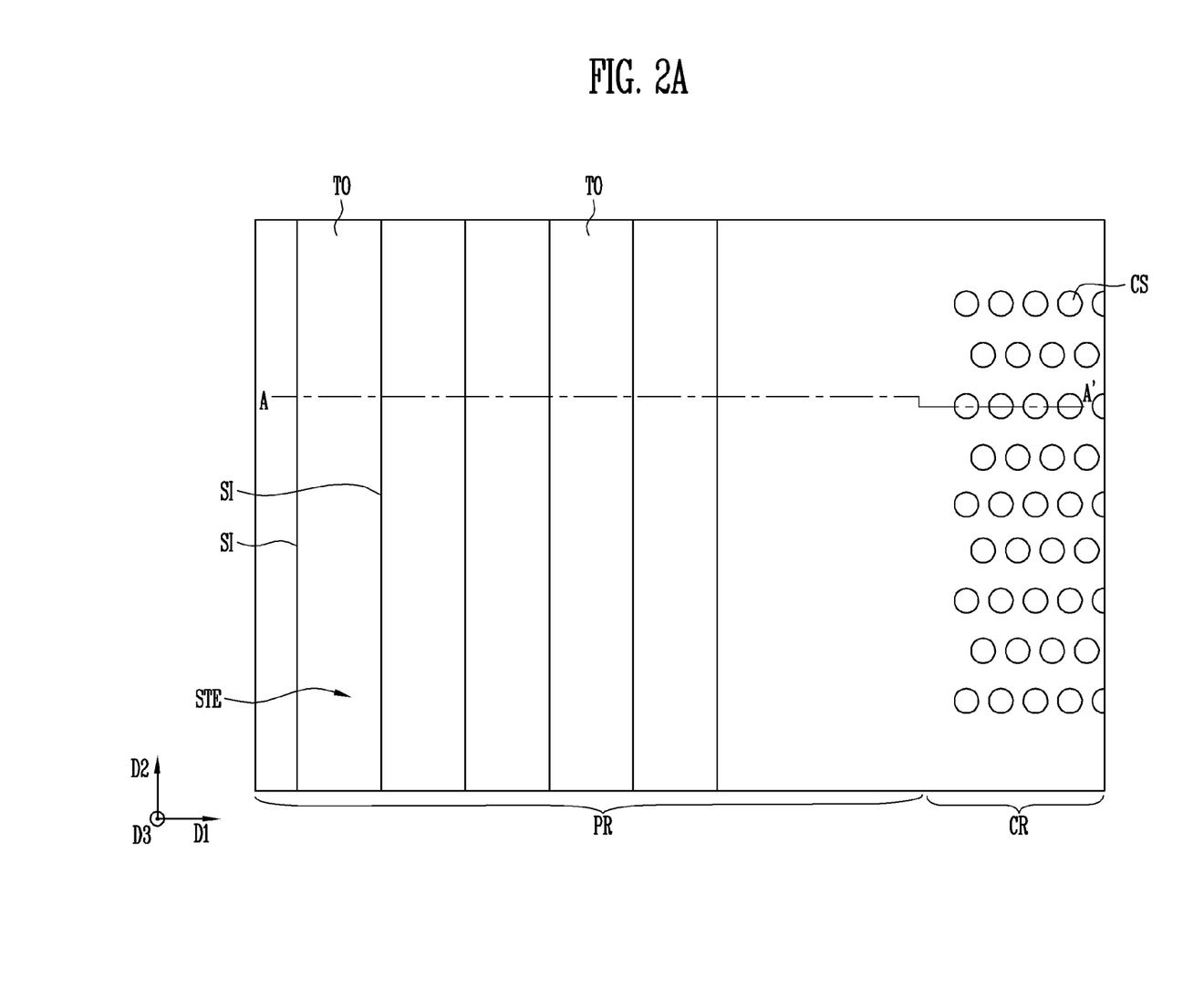
FIGS. 2A, 3A, and 4A are plan views illustrating a manufacturing method of a semiconductor memory device in accordance with an embodiment of the present disclosure.
Figure 2B:
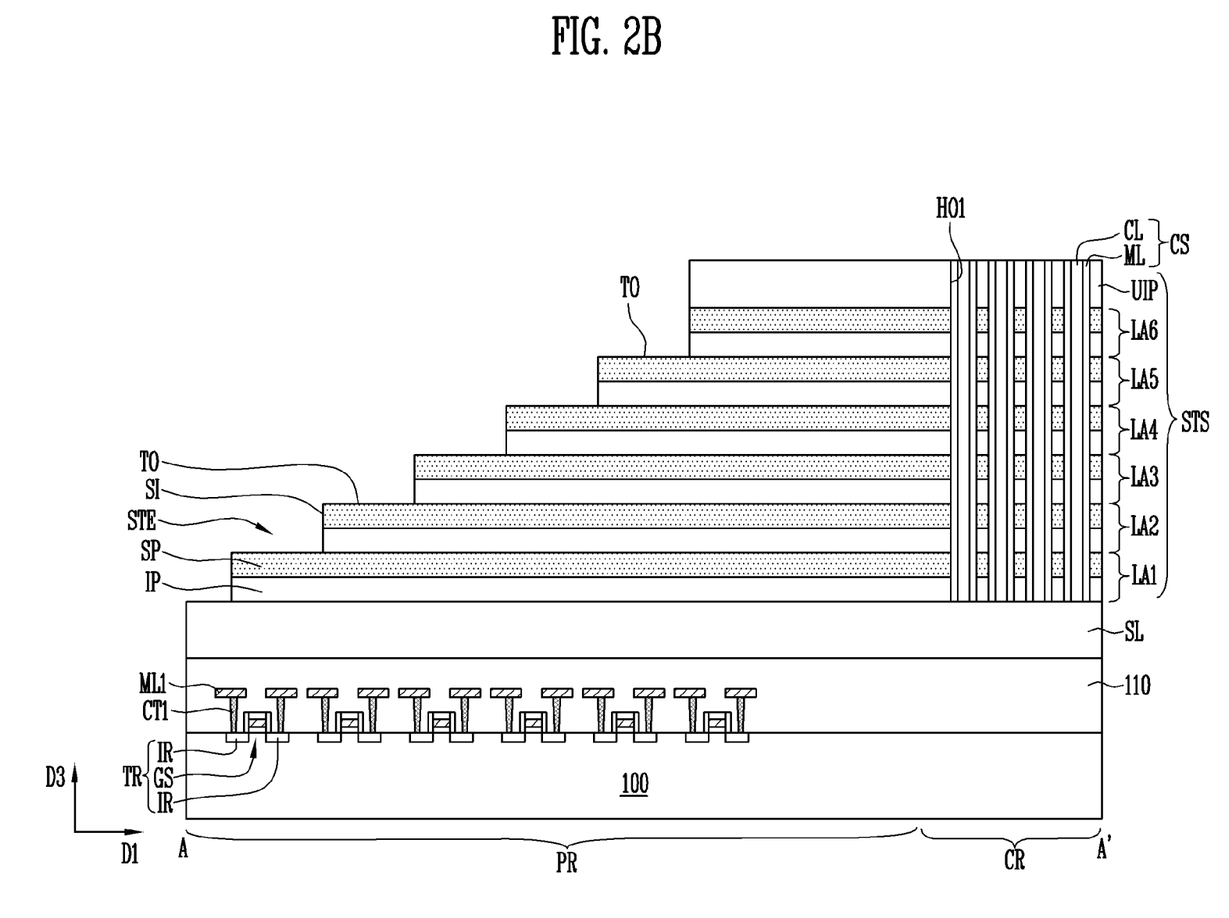
FIGS. 2B, 3B, and 4B are sectional views taken along lines A-A' shown in FIGS. 2A, 3A, and 4A, respectively.
Figure 3A:
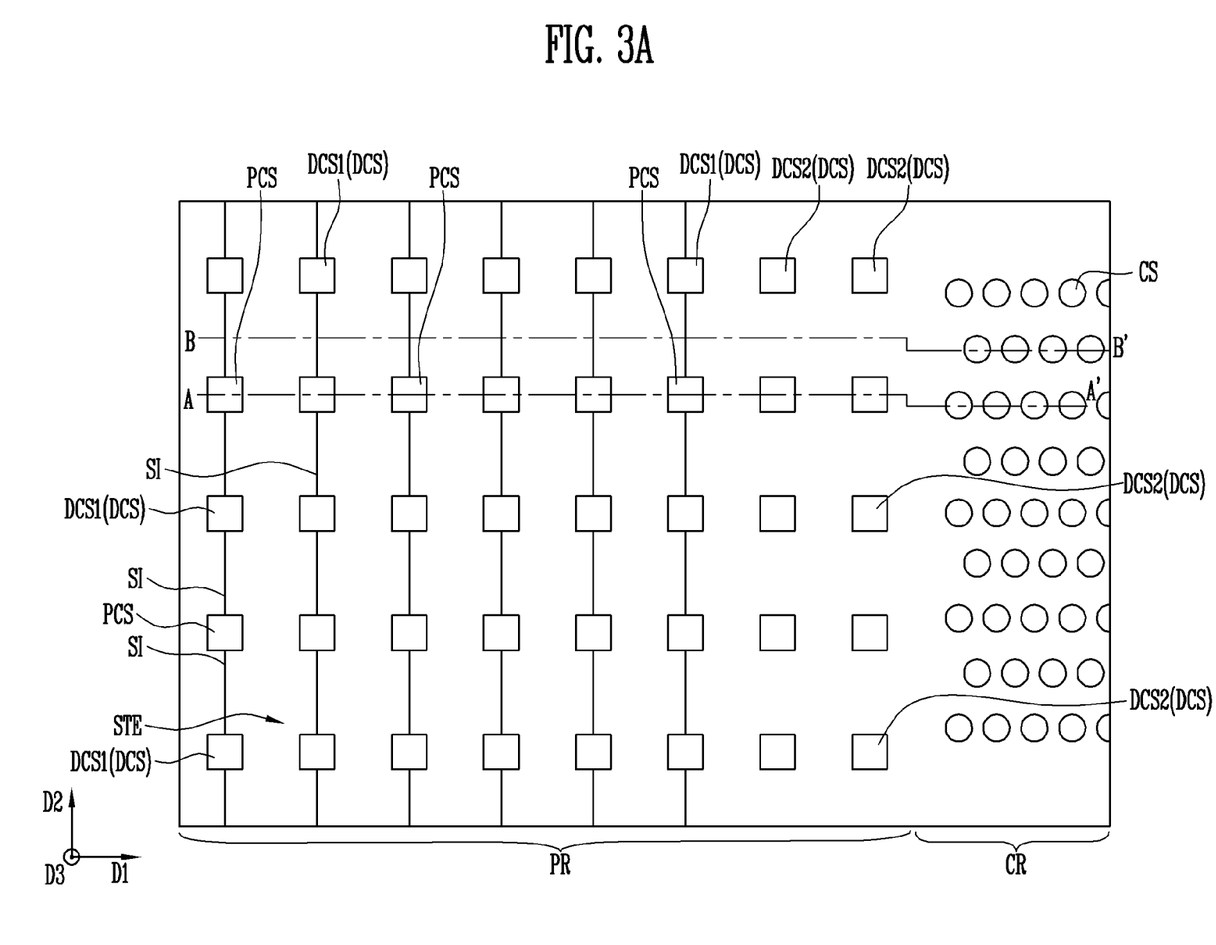
Figure 3B:
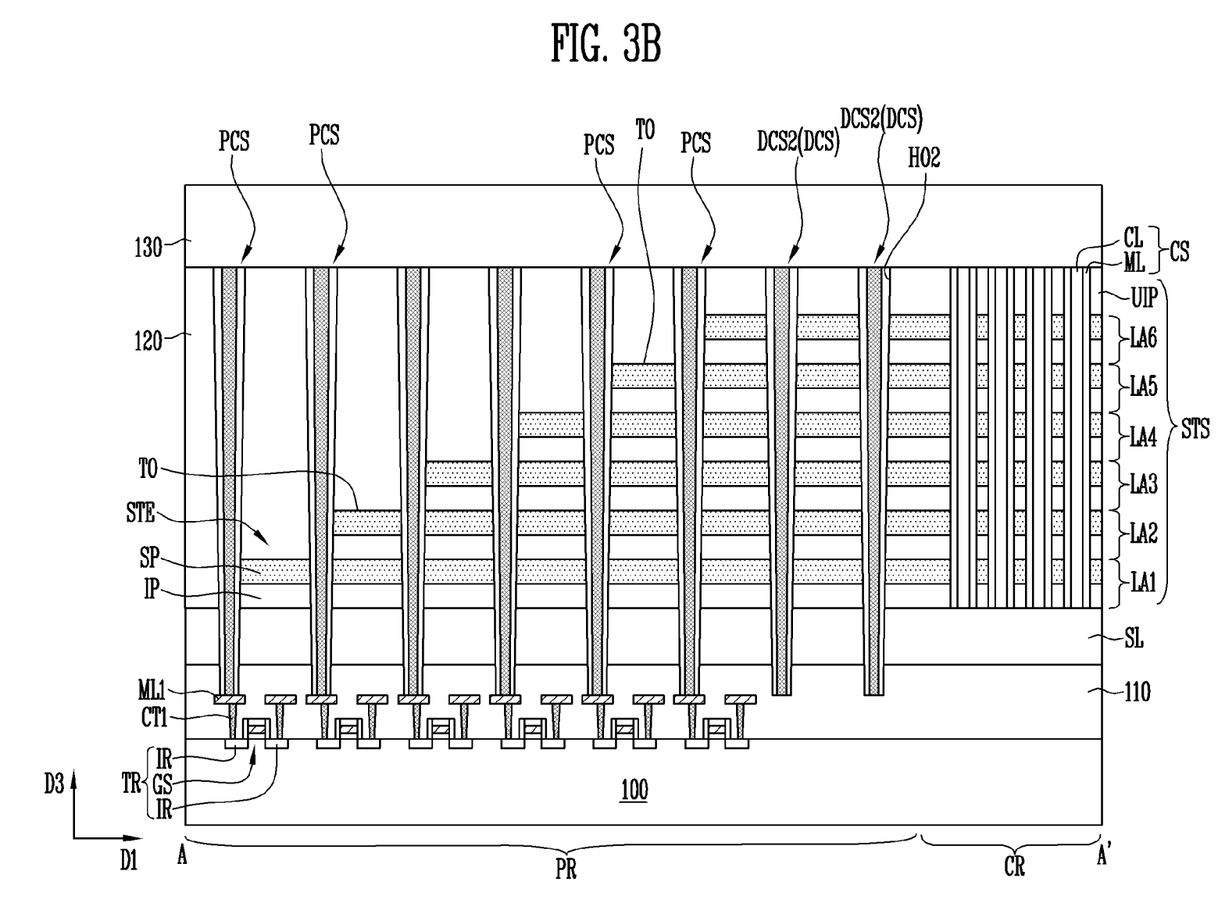
Figure 3C:
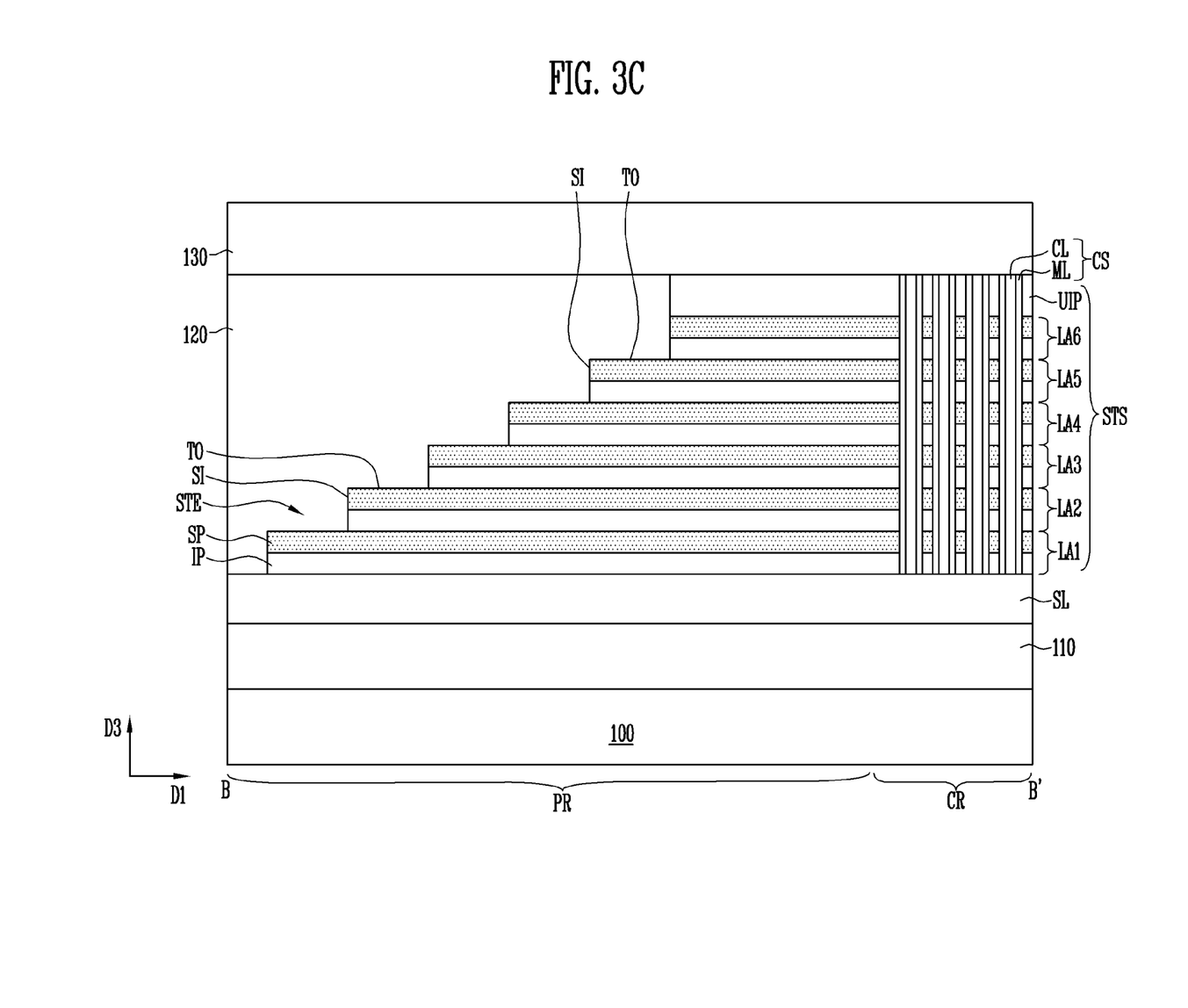
FIGS. 3C and 4C are sectional views taken along lines B-B' shown in FIGS. 3A and 4A, respectively.
Figure 4A:
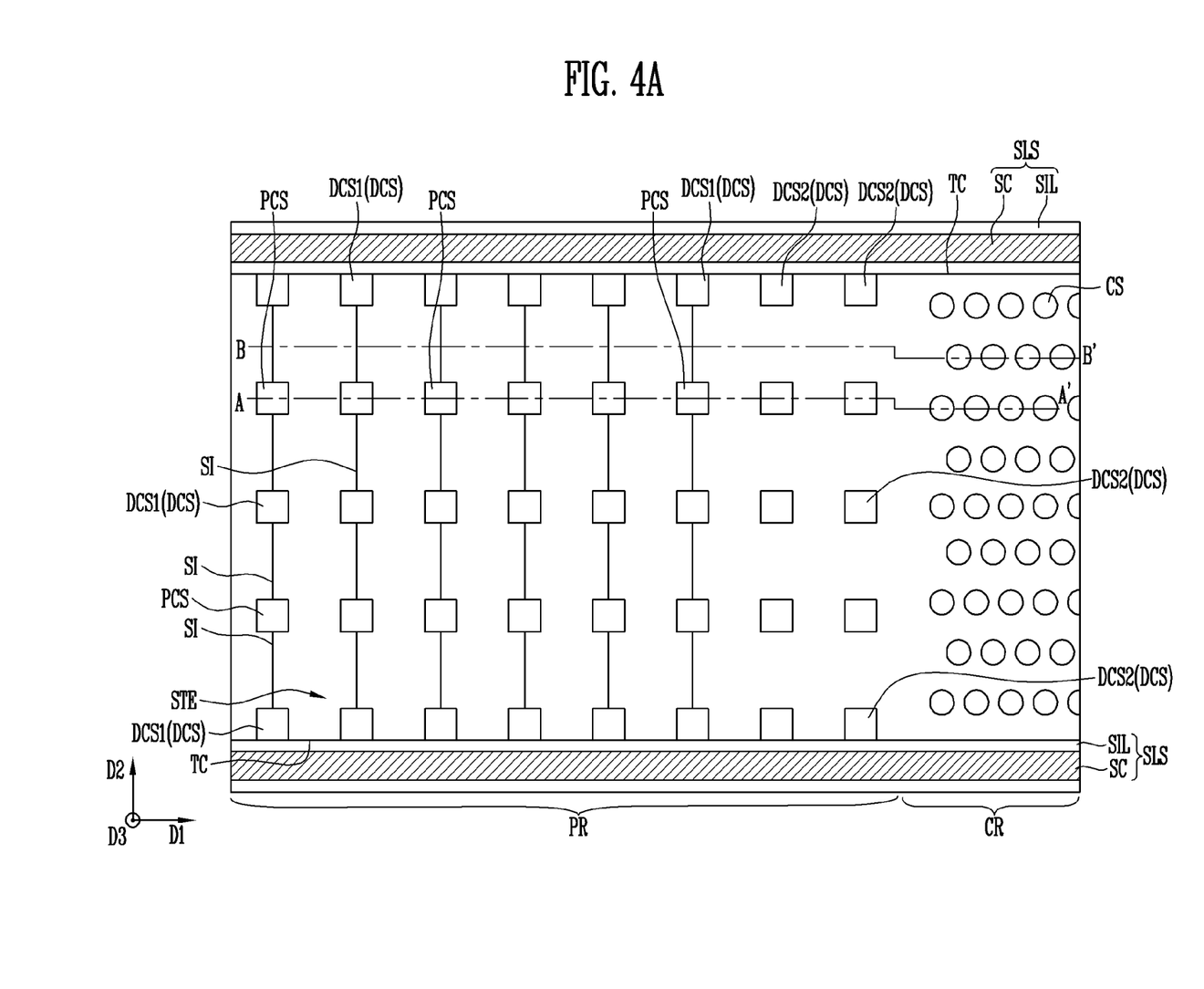
Figure 4B:
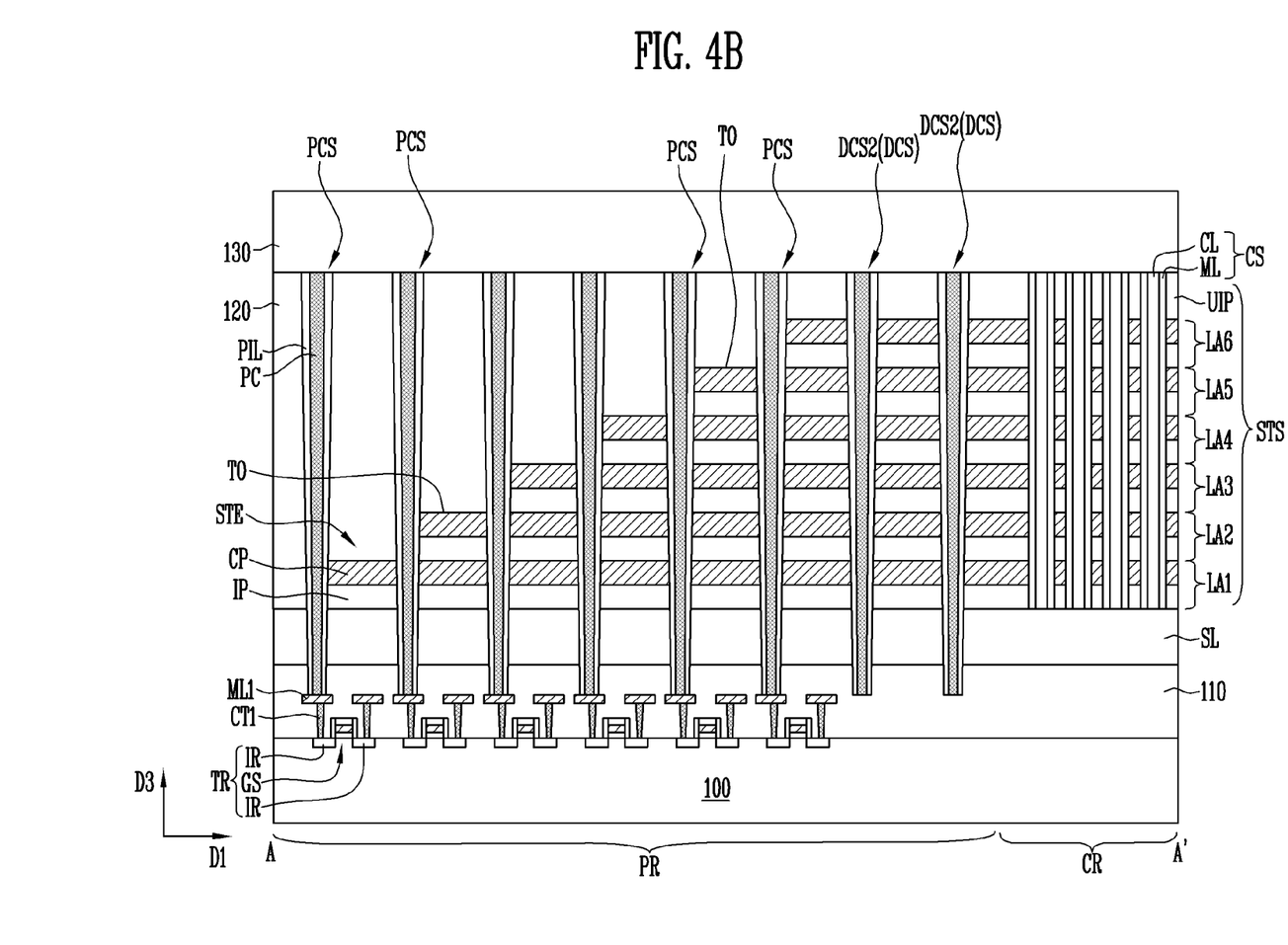
Figure 4C:
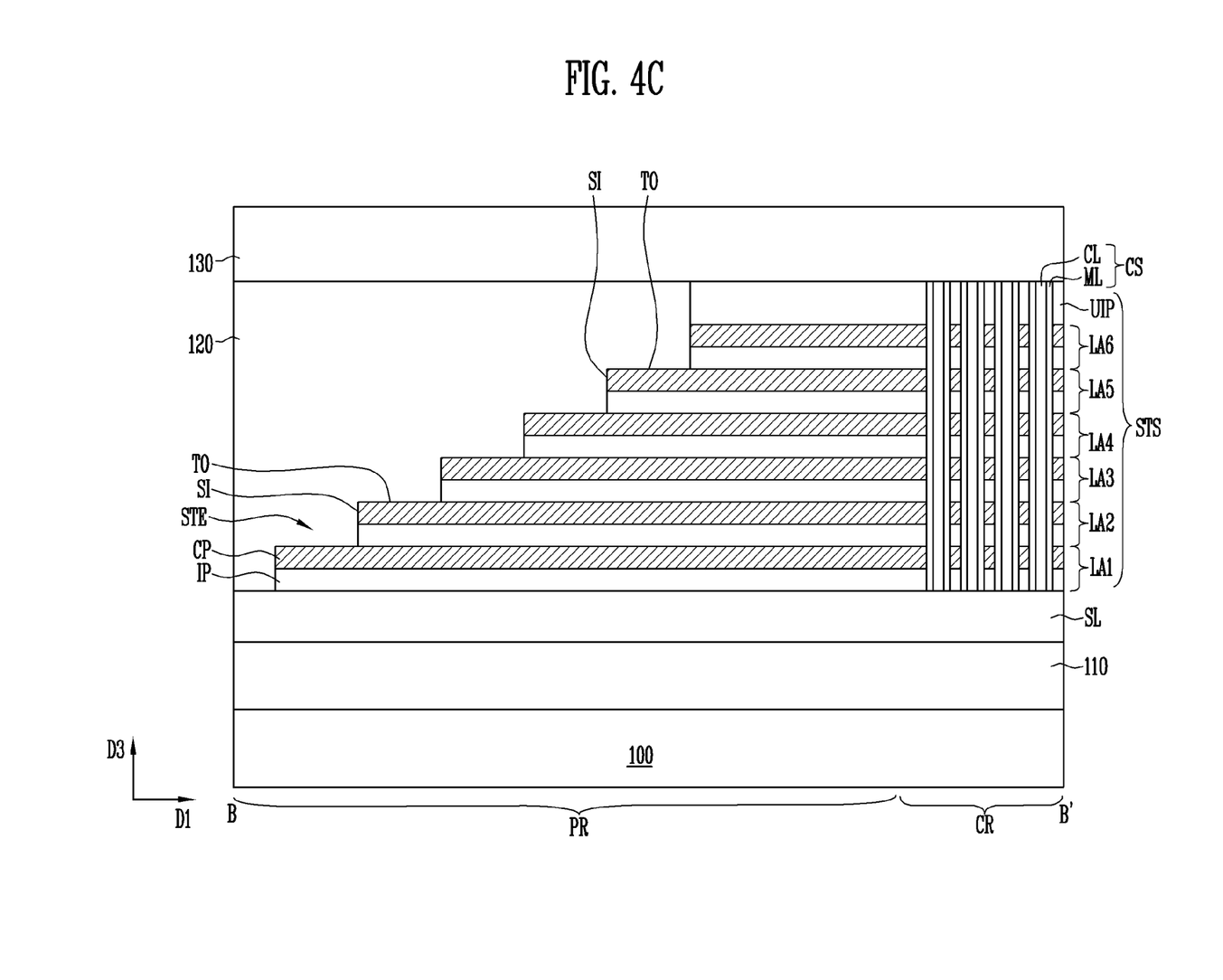

FIGS. 2A, 3A, and 4A are plan views illustrating a manufacturing method of the semiconductor memory device in accordance with an embodiment of the present disclosure. FIGS. 2B, 3B, and 4B are sectional views taken along lines A-A' shown in FIGS. 2A, 3A, and 4A, respectively. FIGS. 3C and 4C are sectional views taken along lines B-B' shown in FIGS. 3A and 4A, respectively.

For convenience of description, components identical to those described with reference to FIGS. 1A to 1C are designated by like reference numerals, and overlapping descriptions will be omitted.

Referring to FIGS. 2A and 2B, peripheral transistors TR may be formed on a substrate 100, and a first insulating layer 110 covering the peripheral transistors TR may be formed. First contacts CT1 and first lines ML1 may be formed in the first insulating layer 110.

A source layer SL may be formed on the first insulating layer 110, and a stack structure STS may be formed on the source layer SL. The process of forming the stack structure STS may include a process of alternately stacking insulating layers and sacrificial layers on the source layer SL and a process of forming an upper insulating layer. In an example, the sacrificial layers may include silicon nitride.

Channel structures penetrating the stack structure STS may be formed. The process of forming the channel structures CS may include a process of forming first holes HO1 penetrating the stack structure STS, a process of filling a portion of each of the first holes HO1 by forming a memory layer ML in the first hole HO1, and a process of completely filling each of the first hole HO1 by forming a channel layer CL in the first hole HO1.

A portion of the stack structure STS disposed on a peripheral region PR of the substrate 100 may be patterned. When the stack structure STS is patterned, a stepped structure STE may be formed in the stack structure STS. In other words, first to sixth stack layers LA1, LA2, LA3, LA4, LA5, and LA6 and an upper insulating pattern UIP of the stack structure STS may be patterned, so that step top surfaces TO and step side surfaces SI are formed. The step top surface TO might not be formed at an uppermost stack layer (i.e., the sixth stack layer LA6) due to the upper insulating pattern UIP. The step top surfaces TO and the step side surfaces SI may be connected to each other, to constitute the stepped structure STE.

Referring to FIGS. 3A, 3B, and 3C, a second insulating layer 120 may be formed, which covers the stepped structure STE of the stack structure STS.

Subsequently, peripheral contact structures PCS and dummy contact structures DCS may be formed, which penetrate the stack structure STS and the source layer SL. The process of forming the peripheral contact structures PCS and the dummy contact structures DCS may include a process of forming second holes HO2 penetrating the stack structure STS and the source layer SL, a process of filling a portion of each of the second holes HO2 by forming a peripheral insulating layer PIL or a dummy insulating layer DIL in the second hole HO2, and a process of completely filling each of the second hole HO2 by forming a peripheral contact PC or a dummy contact DC in the second hole HO2.

When the first holes HO1 and the second holes HO2 are formed, the insulating layers, the sacrificial layers, and the upper insulating layer of the stack structure STS may be patterned. Accordingly, insulating patterns IP, sacrificial patterns SP, and the upper insulating pattern UIP of the stack structure STS are formed.

A third insulating layer 130 may be formed, which covers the stack structure STS, the channel structure CS, the second insulating layer 120, the dummy contact structures DCS, and the peripheral contact structures PCS.

Referring to FIGS. 4A, 4B, and 4C, trenches TC penetrating the stack structure STS may be formed. The trenches TC may extend in a first direction D1. A top surface of the source layer SL may be exposed by the trenches TC. The channel structures CS, the peripheral contact structures PCS, and the dummy contact structures DCS may be disposed between the trenches TC.

Conductive patterns CP may be formed in the stack structure STS. The process of forming the conductive patterns CP in the stack structure STS may include a process of removing the sacrificial patterns SP exposed through the trench TC and a process of filling the conductive patterns CP in empty spaces in which the sacrificial patterns SP are removed.

Because the peripheral contact structure PCS and the dummy contact structure DCS support the insulating patterns IP, the structure of the stack structure STS can be maintained even when the empty spaces are formed as the sacrificial patterns SP are removed.

After the conductive patterns CP are formed, a slit structure SLS may be formed in the trench TC. The process of forming the slit structure SLS may include a process of forming slit insulating layers SIL covering sidewalls of the conductive patterns CP and a process of forming a source contact SC between the slit insulating layers SIL.

Word line contacts WCT may be formed, which are connected to the step top surfaces TO of each of the first to sixth stack layers LA1, LA2, LA3, LA4, LA5, and LA6 of the stack structure STS (see FIGS. 1A to 1C). The process of forming of the word line contact WCT may include a process of forming a third hole exposing the step top surface TO of each of the first to sixth stack layers LA1, LA2, LA3, LA4, LA5, and LA6 and a process of filling the third hole with a conductive material.

Subsequently, second contacts CT2 connected to the peripheral contact structures PCS may be formed (see FIGS. 1A to 1C).

After the second contacts CT2 are formed, peripheral lines PML connecting the word line contacts WCT and the second contacts CT2 may be formed (see FIGS. 1A to 1C). When the peripheral lines PML are formed, the peripheral transistor TR and the conductive pattern CP may be electrically connected to each other through the peripheral contact structure PCS, the second contact CT2, the peripheral line PML, and the word line contact WCT.

Bit line contacts BCT connected to the channel structures CS may be formed (see FIGS. 1A to 1C).

After the bit line contacts BCT are formed, bit lines BL may be formed (see FIGS. 1A to 1C).

Figure 5:
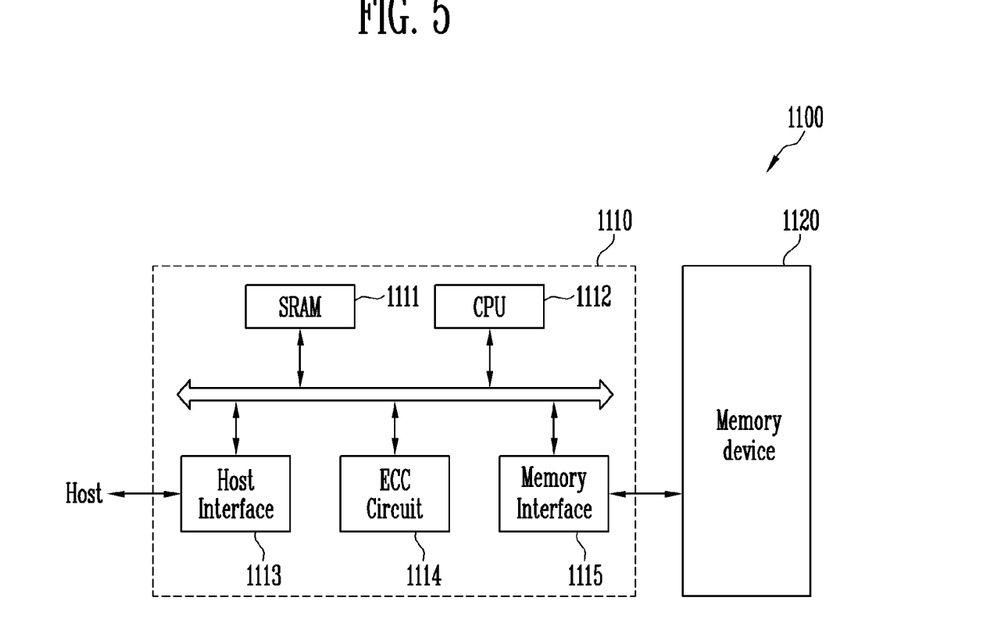
FIG. 5 is a block diagram illustrating a configuration of a memory system in accordance with an embodiment of the present disclosure.

FIG. 5 is a block diagram illustrating a configuration of a memory system 1100 in accordance with an embodiment of the present disclosure.

Referring to FIG. 5, the memory system 1100 in accordance with the embodiment of the present disclosure includes a memory device 1120 and a memory controller 1110.

The memory device 1120 may include the structure described with reference to FIGS. 1A to 1C. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 6:
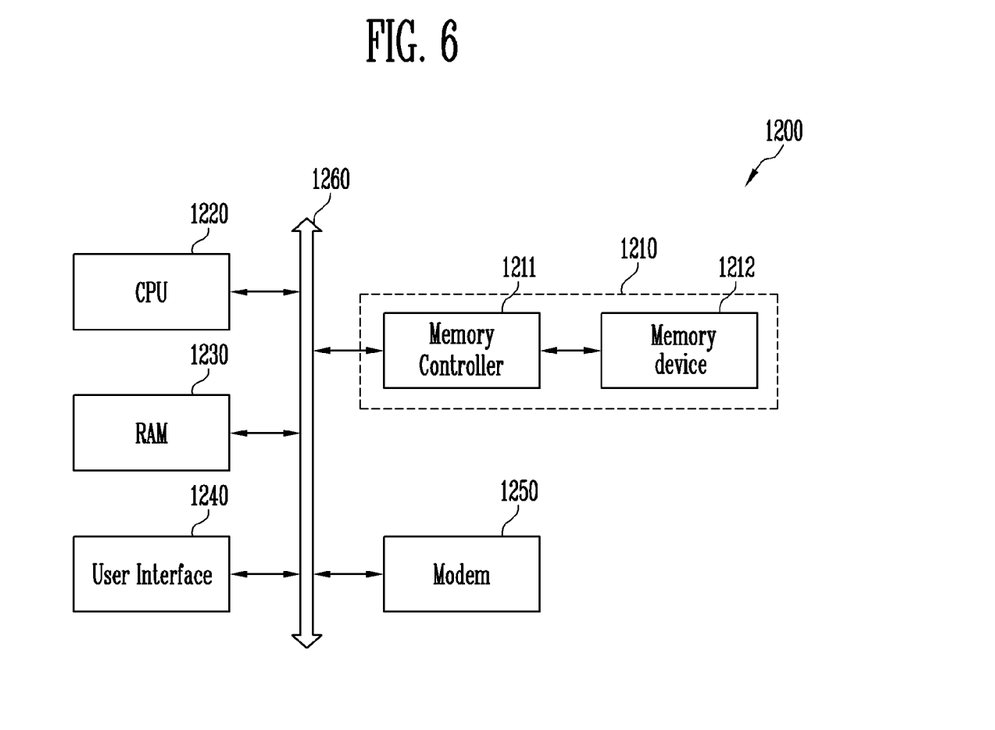
FIG. 6 is a block diagram illustrating a configuration of a computing system in accordance with an embodiment of the present disclosure.

FIG. 6 is a block diagram illustrating a configuration of a computing system 1200 in accordance with an embodiment of the present disclosure.

Referring to FIG. 6, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211 as described with reference to FIG. 5.

In the semiconductor memory device in accordance with the present disclosure, the peripheral transistor and the conductive pattern are electrically connected to each other through the peripheral contact structure supporting the stepped structure of the stack structure. Accordingly, the structure of a line connecting the peripheral transistor and the conductive pattern can be simplified, and the operational reliability of the semiconductor memory device can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed, or some of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of manufacturing a semiconductor memory device, the method comprising:
    forming a peripheral transistor on a substrate;
    forming a source layer over the peripheral transistor;
    forming a stack structure over the source layer;
    forming a peripheral contact structure penetrating the stack structure and the source layer, the peripheral contact structure being electrically connected to the peripheral transistor;
    forming conductive patterns in the stack structure;
    forming a word line contact being electrically connected to at least one of the conductive patterns; and
    forming a peripheral line to electrically connect the word line contact and the peripheral contact structure.

2. The method of claim 1, wherein forming the peripheral contact structure includes:
    forming a hole penetrating the stack structure and the source layer;
    filling a portion of the hole by forming a peripheral insulating layer in the hole; and
    completely filling the hole by forming a peripheral contact in the hole.

3. The method of claim 1, further comprising forming a stepped structure by patterning the stack structure.

4. The method of claim 3, wherein the peripheral contact structure is in contact with a step side surface which defines a surface of the stepped structure.

5. The method of claim 1, wherein forming the peripheral contact structure further includes forming a dummy contact structure penetrating the stack structure and the source layer.

6. The method of claim 5, wherein the dummy contact structure is electrically floated.

7. The method of claim 1, wherein forming the conductive patterns in the stack structure includes:
    forming a trench in the stack structure;
    removing sacrificial patterns exposed through the trench; and
    filling the conductive patterns in empty spaces in which the sacrificial patterns are removed.

* * * * *